(12) United States Patent
Cui et al.

(10) Patent No.: US 10,007,599 B2
(45) Date of Patent: Jun. 26, 2018

(54) METHOD FOR REFRESHING DYNAMIC RANDOM ACCESS MEMORY AND A COMPUTER SYSTEM

(71) Applicant: HUAWEI TECHNOLOGIES CO.,LTD., Shenzhen, Guangdong (CN)

(72) Inventors: Zehan Cui, Beijing (CN); Mingyu Chen, Beijing (CN); Yongbing Huang, Beijing (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 57 days.

(21) Appl. No.: 15/373,888

(22) Filed: Dec. 9, 2016

(65) Prior Publication Data
US 2017/0091087 A1    Mar. 30, 2017

Related U.S. Application Data

(63) Continuation of application No. PCT/CN2015/080989, filed on Jun. 8, 2015.

(30) Foreign Application Priority Data

Jun. 9, 2014    (CN) .......................... 2014 1 0253514

(51) Int. Cl.
   *G06F 12/00*    (2006.01)
   *G06F 12/02*    (2006.01)
   (Continued)

(52) U.S. Cl.
   CPC ............ *G06F 12/023* (2013.01); *G06F 3/061* (2013.01); *G06F 3/0659* (2013.01);
   (Continued)

(58) Field of Classification Search
   None
   See application file for complete search history.

(56) References Cited

U.S. PATENT DOCUMENTS

| 5,825,706 A | 10/1998 | Snowden et al. |
| 6,046,953 A | 4/2000 | Kiehl et al. |

(Continued)

FOREIGN PATENT DOCUMENTS

| CN | 1215865 A | 5/1999 |
| CN | 1232266 A | 10/1999 |

(Continued)

OTHER PUBLICATIONS

Zehan Cui et al. DTail: A Flexible Approach to DRAM Refresh Management. ICS'14, Jun. 10-13, 2014. total 10 pages.

*Primary Examiner* — Midys Rojas
(74) *Attorney, Agent, or Firm* — Huawei Technologies Co., Ltd.

(57) ABSTRACT

A method for refreshing a dynamic random access memory DRAM and a computer system are provided. When an address of a refresh unit in a DRAM and refresh information of the refresh unit are acquired, the address of the refresh unit and the refresh information of the refresh unit are encapsulated as a DRAM access request, where the refresh unit is storage space on which one time of refresh is performed in the DRAM, and the refresh information of the refresh unit includes a refresh cycle of the refresh unit. Then, the address and the refresh information of the refresh unit are written into refresh data space using the DRAM access request, where the refresh data space is storage space that is preset in the DRAM and that is used for storing an address of at least one refresh unit and refresh information of the at least one refresh unit.

19 Claims, 7 Drawing Sheets

(51) Int. Cl.
  *G11C 11/406* (2006.01)
  *G11C 11/4091* (2006.01)
  *G11C 11/4096* (2006.01)
  *G06F 3/06* (2006.01)
  *G06F 12/1009* (2016.01)

(52) U.S. Cl.
  CPC .......... *G06F 3/0665* (2013.01); *G06F 3/0673* (2013.01); *G06F 12/1009* (2013.01); *G11C 11/4091* (2013.01); *G11C 11/4096* (2013.01); *G11C 11/40611* (2013.01); *G11C 11/40618* (2013.01); *G06F 2212/1016* (2013.01); *G06F 2212/152* (2013.01); *G06F 2212/20* (2013.01); *G06F 2212/657* (2013.01)

(56) References Cited

U.S. PATENT DOCUMENTS

| | | | |
|---|---|---|---|
| 6,215,714 | B1 | 4/2001 | Takemae et al. |
| 7,263,020 | B2 | 8/2007 | Pyo et al. |
| 8,358,554 | B2 | 1/2013 | Kim et al. |
| 2002/0191467 | A1 | 12/2002 | Matsumoto et al. |
| 2007/0230265 | A1 | 10/2007 | Riho et al. |
| 2009/0027989 | A1 | 1/2009 | Michalak et al. |
| 2012/0099389 | A1 | 4/2012 | Park et al. |
| 2012/0151232 | A1 | 6/2012 | Fish, III |
| 2012/0300568 | A1 | 11/2012 | Park et al. |
| 2013/0205080 | A1 | 8/2013 | Felton et al. |
| 2013/0279284 | A1 | 10/2013 | Jeong |
| 2013/0282973 | A1 | 10/2013 | Kim et al. |
| 2014/0016421 | A1 | 1/2014 | Kim et al. |
| 2016/0012880 | A1 | 1/2016 | Kim et al. |

FOREIGN PATENT DOCUMENTS

| | | |
|---|---|---|
| CN | 1392565 A | 1/2003 |
| CN | 1406609 A | 4/2003 |
| CN | 1440778 A | 9/2003 |
| CN | 101000798 A | 7/2007 |
| CN | 103246853 A | 8/2013 |
| CN | 104143355 A | 11/2014 |
| JP | 2005216429 A | 8/2005 |
| JP | 2012089137 A | 5/2012 |
| JP | 2012248265 A | 12/2012 |
| JP | 2013229096 A | 11/2013 |
| RU | 2435237 C1 | 11/2011 |

METHOD FOR REFRESHING DYNAMIC RANDOM ACCESS MEMORY AND A COMPUTER SYSTEM

CROSS-REFERENCE TO RELATED APPLICATIONS

This application is a continuation of International Application No. PCT/CN2015/080989, filed on Jun. 8, 2015, which claims priority to Chinese Patent Application No. 201410253514.8, filed on Jun. 9, 2014. The disclosures of the aforementioned applications are hereby incorporated by reference in their entireties.

TECHNICAL FIELD

The present disclosure relates to the field of computers, and in particular, to a method for refreshing a dynamic random access memory and a computer system.

BACKGROUND

In an existing computer system, a cheap and high-density dynamic random access memory (DRAM) is generally used as a system main memory, which is also referred to as a memory. The DRAM stores data using charges in a capacitor. However, these charges constantly leak away due to the existence of electric leakage. Therefore, data in the DRAM needs to be read and rewritten regularly, so as to compensate for charges that leak away, and such an operation is referred to as refresh.

The DRAM includes multiple banks, and each Bank is a two-dimensional storage array, where a horizontal line is referred to as a row, and a vertical line is referred to as a column. In a refresh process, the DRAM selects one row (which is also referred to as a memory row) each time, and extracts all data in the row to a sense amplifier (which is also referred to as a row buffer, Row Buffer); such a process is referred to as an activation operation. Then, the DRAM completes, in the row buffer, read and write of corresponding data, and data in the row buffer is rewritten into the storage array, which is referred to as a pre-charge operation. By means of the activation operation and the pre-charge operation, the whole refresh process is implemented. DRAM refresh causes relatively large overheads to a computer system. Because the DRAM cannot respond to a normal memory access request in the refresh process, performance overheads are caused; and besides, a refresh operation is a power-consuming operation, which causes energy consumption overheads.

An existing refresh method is to refresh all rows in the DRAM using a same cycle, so as to ensure that data in a unit suffering from the most severe electric leakage is not lost.

In a process of completing the present disclosure, it is found that the prior art has the following problems: As a capacity of the DRAM increases continuously, a manner of refreshing all memory rows using a same cycle has increasingly large performance overheads and energy consumption overheads, which significantly affects energy efficiency of a system.

SUMMARY

Based on this, embodiments of the present disclosure provide a method for refreshing a dynamic random access memory and a computer system, so as to effectively reduce overheads in a refresh process.

A first aspect of the embodiments of the present disclosure provides a processing method for refreshing information of a dynamic random access memory (DRAM), and the method includes:

acquiring an address of a refresh unit in a DRAM and refresh information of the refresh unit, where the refresh unit is storage space on which one time of refresh is performed in the DRAM, and the refresh information of the refresh unit includes a refresh cycle of the refresh unit; and encapsulating the address of the refresh unit and the refresh information of the refresh unit as a DRAM access request, and writing the address of the refresh unit and the refresh information of the refresh unit into refresh data space using the DRAM access request, where the refresh data space is preset storage space in the DRAM.

With reference to the first aspect, in a first possible implementation manner, before the writing the address of the refresh unit and the refresh information of the refresh unit into refresh data space using the DRAM access request, the method further includes: allocating, in the DRAM, the preset storage space as the refresh data space.

With reference to the first aspect or the first possible implementation manner of the first aspect, in a second possible implementation manner, the acquired address of the refresh unit includes a physical address of the refresh unit; and the encapsulating the address of the refresh unit and the refresh information of the refresh unit as a DRAM access request, and writing the address of the refresh unit and the refresh information of the refresh unit into the refresh data space using the DRAM access request includes:

encapsulating the physical address of the refresh unit and the refresh information of the refresh unit as the DRAM access request, and writing the physical address and the refresh information of the refresh unit into the refresh data space using the DRAM access request.

With reference to the first aspect or the first possible implementation manner of the first aspect, in a third possible implementation manner, the acquired address of the refresh unit includes a virtual address of the refresh unit; and before the encapsulating the address of the refresh unit and the refresh information of the refresh unit as a DRAM access request, the method further includes:

converting the virtual address of the refresh unit into a physical address of the refresh unit by querying a page table; and the encapsulating the address of the refresh unit and the refresh information of the refresh unit as a DRAM access request, and writing the address of the refresh unit and the refresh information of the refresh unit into the refresh data space using the DRAM access request includes:

encapsulating the physical address of the refresh unit and the refresh information of the refresh unit as the DRAM access request, and writing the physical address and the refresh information of the refresh unit into the refresh data space using the DRAM access request.

A second aspect of the embodiments of the present disclosure provides a processing apparatus for refreshing information of a dynamic random access memory DRAM, and the apparatus includes:

an acquiring unit, configured to acquire an address of a refresh unit in a DRAM and refresh information of the refresh unit, where the refresh unit is storage space on which one time of refresh is performed in the DRAM, and the refresh information of the refresh unit includes a refresh cycle of the refresh unit;

an encapsulation unit, configured to encapsulate the address of the refresh unit and the refresh information of the refresh unit as a DRAM access request; and a write unit, configured to write the address of the refresh unit and the refresh information of the refresh unit into refresh data space using the DRAM access request, where the refresh data space is a piece of preset storage space in the DRAM.

With reference to the second aspect, in a first possible implementation manner, the apparatus further includes an allocating unit, configured to allocate, in the DRAM, the preset storage space as the refresh data space.

With reference to the second aspect or the first possible implementation manner of the second aspect, in a second possible implementation manner, the address, acquired by the acquiring unit, of the refresh unit includes a physical address of the refresh unit;

the encapsulation unit is specifically configured to encapsulate the physical address of the refresh unit and the refresh information of the refresh unit as the DRAM access request; and the write unit is specifically configured to write the physical address and the refresh information of the refresh unit into the refresh data space using the DRAM access request.

With reference to the second aspect or the first possible implementation manner of the second aspect, in a third possible implementation manner, the address, acquired by the acquiring unit, of the refresh unit includes a virtual address of the refresh unit; and the apparatus further includes:

a conversion processing unit, configured to convert the virtual address of the refresh unit into a physical address of the refresh unit by querying a page table;

the encapsulation unit is specifically configured to encapsulate the physical address of the refresh unit and the refresh information of the refresh unit as the DRAM access request; and the write unit is specifically configured to write the physical address and the refresh information of the refresh unit into the refresh data space using the DRAM access request.

A third aspect of the embodiments of the present disclosure provides a processing apparatus for refreshing information of a dynamic random access memory DRAM, where the processing apparatus includes:

a processor, a memory, a communications interface, and a bus, where the processor, the memory, and the communications interface perform communication using the bus;

the memory is configured to store a program;

the communications interface is configured to communicate with a DRAM; and when the processing apparatus is running, the processor is configured to execute the program stored in the memory, so as to perform the method according to any one of the first aspect or the possible implementation manners of the first aspect.

A fourth aspect of the embodiments of the present disclosure provides a method for refreshing a dynamic random access memory DRAM, and the method includes:

generating a refresh command for a refresh unit in a DRAM, where the refresh command includes a physical address of the refresh unit, and the refresh unit is storage space on which one time of refresh is performed in the DRAM;

reading, from refresh data space, refresh information of the refresh unit according to the physical address of the refresh unit and using a DRAM read command, where the refresh information of the refresh unit includes a refresh cycle of the refresh unit; and performing a refresh operation on the refresh unit according to the refresh information.

With reference to the fourth aspect, in a first possible implementation manner, the reading, from refresh data space, refresh information of the refresh unit according to the physical address of the refresh unit and using a DRAM read command includes:

determining the refresh information of the refresh unit according to the physical address of the refresh unit and a correspondence that is stored in the refresh data space and that is between the physical address of the refresh unit and the refresh information of the refresh unit, and reading, from the refresh data space, the refresh information of the refresh unit using the DRAM read command.

With reference to the fourth aspect or the first possible implementation manner of the fourth aspect, in a second possible implementation manner, the refresh data space is storage space that is preset in the DRAM and that is used for storing refresh information of multiple refresh units in the DRAM, and the method further includes:

acquiring, from the refresh data space, refresh information of multiple successive refresh units that are after the refresh unit.

With reference to the second possible implementation manner of the fourth aspect, in a third possible implementation manner, after the acquiring, from the refresh data space, refresh information of multiple successive refresh units that are after the refresh unit, the method further includes:

receiving a refresh command for the multiple successive refresh units that are after the refresh unit;

determining whether a quantity of refresh units, on which a refresh operation needs to be performed, in the multiple successive refresh units exceeds a threshold;

performing a refresh operation of Auto Refresh on the multiple successive refresh units when it is determined that the quantity of refresh units on which a refresh operation needs to be performed exceeds the threshold; or performing a refresh operation of RAS-Only Refresh on the multiple successive refresh units when it is determined that the quantity of refresh units on which a refresh operation needs to be performed does not exceed the threshold.

A fifth aspect of the embodiments of the present disclosure provides a DRAM controller, and the DRAM controller includes:

a refresh command generating module, configured to generate a refresh command for a refresh unit in a DRAM, where the refresh command includes a physical address of the refresh unit, and the refresh unit is storage space on which one time of refresh is performed in the DRAM;

an acquiring module, configured to acquire, from refresh data space, refresh information of the refresh unit according to the physical address of the refresh unit and using a DRAM read command, where the refresh information of the refresh unit includes a refresh cycle of the refresh unit; and an execution module, configured to perform a refresh operation on the refresh unit according to the refresh information.

With reference to the fifth aspect, in a first possible implementation manner, the acquiring module includes:

a querying unit, configured to determine the refresh information of the refresh unit according to the physical address of the refresh unit and a correspondence that is stored in the refresh data space and that is between the physical address of the refresh unit and the refresh information of the refresh unit; and a read unit, configured to read, from the refresh data space, the refresh information of the refresh unit using the DRAM read command.

With reference to the fifth aspect or the first possible implementation manner of the fifth aspect, in a second possible implementation manner, the acquiring module is further configured to acquire, from the refresh data space, refresh information of multiple successive refresh units that are after the refresh unit.

With reference to the second possible implementation manner of the fifth aspect, in a third possible implementation manner, the execution module includes:

a receiving unit, configured to receive a refresh command for the multiple successive refresh units that are after the refresh unit;

a determining unit, configured to determine whether a quantity of refresh units, on which a refresh operation needs to be performed, in the multiple successive refresh units exceeds a threshold; and an execution unit, configured to perform a refresh operation of Auto Refresh on the multiple successive refresh units when it is determined that the quantity of refresh units on which a refresh operation needs to be performed exceeds the threshold; or perform a refresh operation of RAS-Only Refresh on the multiple successive refresh units when it is determined that the quantity of refresh units on which a refresh operation needs to be performed does not exceed the threshold.

A sixth aspect of the embodiments of the present disclosure provides a system for refreshing a dynamic random access memory DRAM, where the system includes a dynamic random access memory DRAM including at least one refresh unit, and the DRAM controller according to any one of the fifth aspect or the possible implementation manners of the fifth aspect.

According to the method for refreshing a dynamic random access memory and the computer system provided in the embodiments of the present disclosure, refresh information of a refresh unit in a DRAM is acquired, where the refresh information includes a refresh cycle of the refresh unit, and the refresh information is written into a piece of preset storage space, that is, refresh data space, in the DRAM; in a process of refreshing a refresh unit in the DRAM, a DRAM controller reads, from the refresh data space, refresh information corresponding to the refresh unit using a DRAM read command, and performs a refresh operation on the corresponding refresh unit using the refresh information. By means of the foregoing manner, in a case in which a DRAM capacity continuously increases, on one hand, pertinent refresh can be performed according to refresh information of a refresh unit, avoiding a problem of relatively large performance overheads and energy-consumption overheads caused by refresh performed according to a same cycle in the prior art, and on the other hand, refresh information of a refresh unit is stored in DRAM space, so that in the case in which the storage capacity of the DRAM continuously increases, a requirement on storage space, which results from an increase in data volume of refresh information, can be met.

BRIEF DESCRIPTION OF DRAWINGS

To describe the technical solutions in the embodiments of the present disclosure more clearly, the following briefly introduces the accompanying drawings required for describing the embodiments. Apparently, the accompanying drawings in the following description show merely some embodiments of the present.

DESCRIPTION OF EMBODIMENTS

The following clearly and completely describes the technical solutions in the embodiments of the present disclosure with reference to the accompanying drawings in the embodiments of the present disclosure. Apparently, the described embodiments are a part rather than all of the embodiments of the present disclosure.

Although the following descriptions focus on a DRAM device, a person skilled in the art understands that, the present disclosure can be applied to any type of storage device that includes multiple units and needs to be refreshed at regular intervals or maintained in another manner to reserve content thereof. A person skilled in the art also understands that, although the following descriptions focus on a storage device in which storage units are organized into a two-dimensional row-column array, storage units may be organized in multiple manners, including being organized into multiple banks (Bank) and being interleaved or not interleaved, being organized into an array of more than two dimensions, being organized to be content addressable, or the like. In addition, although at least a part of the following discussion focuses on a memory in a computer system, a person skilled in the art understands that the present disclosure claimed may be implemented in combination with another electronic device or system having a memory device.

System Architecture of the Embodiments of the Present Disclosure

Figure 1:
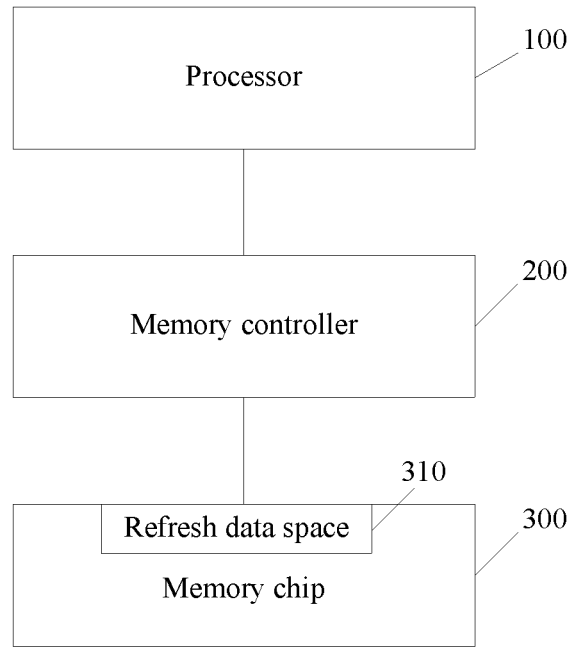
FIG. 1 is a diagram of a system architecture on which an embodiment of the present disclosure is based.

FIG. 1 shows a schematic networking diagram of a memory refresh system according to an embodiment of the present disclosure. The memory refresh system includes a processor 100, a memory controller 200, and a memory chip 300. The processor 100 reads data from and writes data into the memory chip 300 using the memory controller 200. During specific implementation, the processor 100 and the memory controller 200 may be integrated into a same chip, or may also be separately implemented by means of two different chips.

In the memory chip 300, a piece of storage space is preset as refresh data space 310, and the refresh data space may be a continuous area, or may be multiple scattered areas. When allocating memory to an application program, an operating system cannot allocate the foregoing area.

The memory chip 300 is generally implemented by a DRAM chip, and when the memory chip 300 is implemented by the DRAM chip, the memory controller 200 may be implemented by a DRAM controller.

Embodiments of the Present Disclosure

Currently, with a continuous increase in a storage capacity of a memory, how to reduce performance and power-consumption overheads of memory refresh becomes a problem.

A refresh method generally used in the industry is to refresh all rows in a memory using a same cycle, so as to ensure that data in a unit suffering from most severe electric leakage is not lost. Specifically, there are two refresh manners as follows:

(1) An auto refresh (AR) manner: A counter RAC is maintained in a memory chip, and directs to a next to-be-refreshed row. A memory controller sends a refresh command at intervals of a tREFI time, and after the memory chip receives the command, a refresh operation is performed simultaneously on a group of rows (where a quantity of the rows is determined by a density of the memory chip) directed to, in all Banks, by the RAC. Duration of the refresh operation is tRFC, and during this period, the memory chip cannot respond to a normal memory access request. After the tRFC time, the memory chip updates a value of the counter and makes the counter direct to a next group of to-be-refreshed rows.

(2) An RAS-Only Refresh (ROR) manner: A memory controller sends a row address strobe (RAS) command, and extracts data in one row from a memory to a row buffer, and then the data of the row is rewritten into a storage unit by means of a subsequent pre-charge command, so as to complete refresh of the data of the row. In this case, the memory controller maintains a counter RAC therein and sends an RAS command periodically. In such a refresh manner, only one row is refreshed each time, and when the row is refreshed, other Banks may still be accessed.

In the foregoing AR manner, a refresh granularity is relatively large, and average refresh overheads of each row are relatively small; however, when some rows in the memory store invalid data (that is, the invalid data does not need to be refreshed) or stores non-critical data (the non-critical data does not need to refreshed at relatively high frequency), overheads of the foregoing AR manner are relatively large. In the ROR manner, a refresh granularity is relatively small, and a to-be-refreshed row is specified by a memory controller, which allows the memory controller to perform flexible control; however, average refresh overheads of each row in the ROR manner are relatively large.

In the foregoing memory, each row of to-be-refreshed data constitutes a refresh unit. In specific implementation, the refresh unit may be one memory row, or may be multiple memory rows, or may be a granularity smaller than a memory row, which is not limited in any embodiment of the present disclosure.

To improve efficiency of refreshing memory data and reduce refresh overheads, refresh parameters of each refresh unit may be determined using the following three parameters:

(1) Data holding time: The data holding time is represented by $T_0$, and is a preset refresh cycle of a refresh unit. For example, if the refresh unit is refreshed at intervals of 64 milliseconds, the preset refresh cycle $T_0$=64 ms.

(2) Data validity: The data validity is represented by $\mu$ and is used to measure validity of data stored in a refresh unit. If the data stored in the refresh unit is valid data, $\mu$=1, and if the data stored in the refresh unit is invalid data, $\mu$=0. The data validity is determined by an operating system.

(3) Data criticality: The data criticality is represented by $\lambda$ and is used to measure criticality of data stored in a refresh unit. According to levels of the data criticality, a value range of the data criticality of the data stored in the refresh unit is $0<\lambda \leq 1$. The data criticality may be set by the operating system, or the data criticality may be set by a user and notified to the operating system.

The following relationship exists between a refresh cycle of a refresh unit and the foregoing three parameters: refresh cycle=preset refresh cycle*data validity/data criticality, which is expressed as follows using symbols: refresh cycle $T=T_0*\mu/\lambda$ (which is applicable to a case in which $\mu \neq 0$). It should be noted that when refresh data of a refresh unit is invalid data, in this case, a refresh cycle of the refresh unit is infinite, that is, the refresh unit is not refreshed.

A description is provided using an example: For a refresh unit that stores valid data having data criticality of 1, a refresh cycle of the refresh unit=$T_0*1/1$=T; for a refresh unit that stores non-critical valid data, data criticality $\lambda$ (where $0< \leq 1$) may be determined according to the data criticality set by an operating system, and refresh is performed using a product of a preset refresh cycle selected by the system and an adjustment factor, that is, $T_0*(1/\lambda)$.

As an example, for a refresh unit, a data holding time $T_0$ (that is, the preset refresh cycle) of the refresh unit is 64 milliseconds, data validity $\mu$ is 1, and data criticality $\lambda$ is 0.5, and therefore, according to the foregoing calculation formula, it is determined that a refresh cycle of the refresh unit is 64*2 (milliseconds).

As an example, using one information storage format, refresh information of refresh units having different data criticality may be expressed using Table 1. In the following table, refresh information of one refresh unit may be represented using four bits. It should be noted that, how many bits are used to represent refresh information is based on user-defined settings. With more bits, more options of a refresh cycle can be represented. For a person of ordinary skill in the art, a quantity of bits for representing the refresh information is selected according to a specific refresh requirement, which is not limited in any embodiment of the present disclosure. The following Table 1 is merely used as an example for description.

It can be seen from the following Table 1 that, the refresh information represented using four bits actually includes a refresh cycle corresponding to the refresh unit.

TABLE 1

| Refresh information | | | | Represented |
|---|---|---|---|---|
| Data validity identifier | Refresh cycle identifier | | | refresh cycle |
| 0 | NULL | NULL | NULL | No refresh |
| 1 | 0 | 0 | 0 | 64 ms |
| 1 | 0 | 0 | 1 | 2 * 64 ms |
| 1 | 0 | 1 | 0 | 4 * 64 ms |
| ... | ... | ... | ... | ... |
| 1 | 1 | 1 | 1 | 128 * 64 ms |

Method Embodiment 1

Figure 2A:
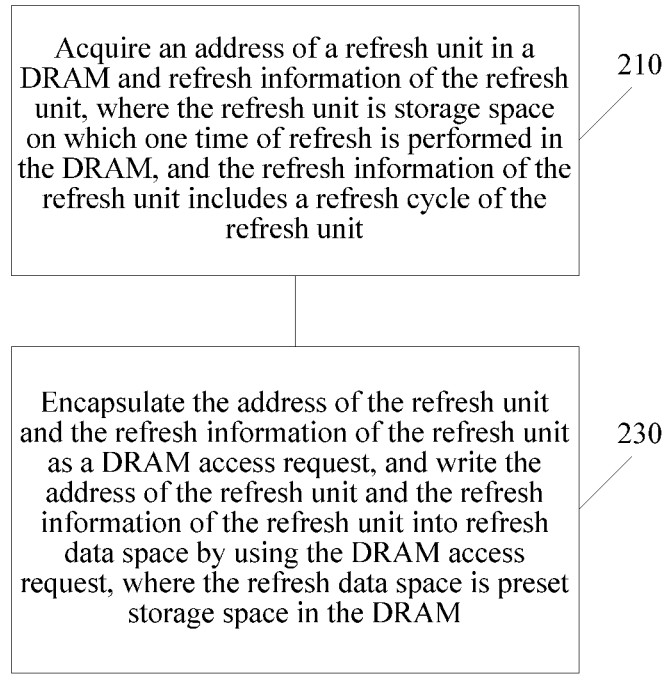
FIG. 2A is a flowchart of a first implementation manner of Method Embodiment 1 according to the present disclosure.

Referring to FIG. 2A, this embodiment provides a processing method for refreshing information of a dynamic random access memory DRAM. A process of the method is:

210: Acquire an address of a refresh unit in a DRAM and refresh information of the refresh unit, where the refresh unit is storage space on which one time of refresh is performed in the DRAM, and the refresh information of the refresh unit includes a refresh cycle of the refresh unit.

Specifically, this method embodiment may be executed by an operating system.

An address of a refresh unit may be a physical address of the refresh unit, or a virtual address of the refresh unit.

In the prior art, refresh information may be acquired in many acquiring manners. For example, on software, the refresh information may be determined by means of a test on a data holding time, monitoring on page allocation/release, or a mark of a user; and on hardware, the refresh information may be determined by means of a test on a data holding time, a history of recent access to data, and the like. This is not described in this embodiment of the present disclosure in detail.

Specifically, before the acquiring refresh information of a refresh unit in a DRAM, the method further includes a step of converting parameters, such as a data holding time, data validity, and data criticality, of a refresh unit into refresh information of the refresh unit. For a specific conversion process, reference may be made to a related description in the foregoing Table 1.

Information included in the foregoing refresh information of the refresh unit is a refresh cycle of the refresh unit.

230: Encapsulate the address of the refresh unit and the refresh information of the refresh unit as a DRAM access request, and write the address of the refresh unit and the refresh information of the refresh unit into refresh data space using the DRAM access request, where the refresh data space is preset storage space in the DRAM.

Specifically, the operating system may write the address and the refresh information of the refresh unit into the refresh data space using an existing DRAM access request.

Figure 2B:
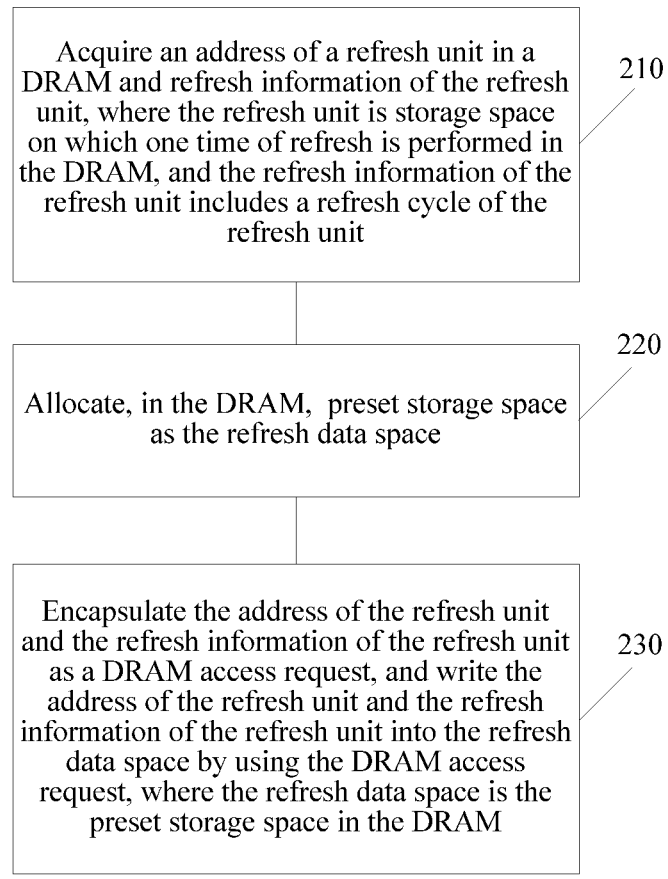
FIG. 2B is a flowchart of a second implementation manner of Method Embodiment 1 according to the present disclosure.

Further, before the step 230 of writing the address of the refresh unit and the refresh information of the refresh unit into refresh data space using the DRAM access request, referring to FIG. 2B, the method further includes:

220: Allocate, in the DRAM, the preset storage space as the refresh data space.

It should be noted that, there is no strict sequential relationship between step 220 and step 210. In a specific implementation process, step 210 may be first performed, and then step 220 is performed; or step 220 may be first performed, and then step 210 is performed, which is not limited in this embodiment of the present disclosure.

The foregoing step 220 of allocating, in the DRAM, a piece of storage space as the refresh data space may be implemented using the following manners:

(1) The operating system applies to memory space for an area to store refresh information, and notifies an address range of the area to a memory controller.

(2) A basic input/output system (BIOS) reserves an area in memory space to store refresh information, and notifies an address range of the area to an operating system and a memory controller.

(3) A memory controller reserves an area in memory space to store refresh information, and notifies an address range of the area to an operating system.

The refresh data space may be a continuous area, or may be multiple scattered areas. When memory is allocated to an application program, the operating system cannot allocate the foregoing area.

It should be noted that, the address of the refresh unit and the refresh information of the refresh unit are written into the refresh data space, and in this way, a correspondence between the physical address of the refresh unit and the refresh information of the refresh unit is established in the refresh data space. As an example, a structure of the refresh data space is shown in Table 2 (where it may be understood that, storing the correspondence between the physical address of the refresh unit and the refresh information of the refresh unit in a form of a table is merely one implementation manner, and this embodiment of the present disclosure does not exclude other implementation manners):

TABLE 2

| Physical address of a refresh unit | Refresh information | | |
|---|---|---|---|
| | Data validity identifier | Refresh cycle identifier | |
| Refresh unit 1 | 1 | 0 | 0 | 0 |
| Refresh unit 2 | 0 | x | x | x |
| Refresh unit 3 | 1 | 1 | 1 | 1 |
| Refresh unit 4 | 1 | 0 | 0 | 1 |
| Refresh unit 5 | 1 | 0 | 1 | 0 |

Figure 2C:
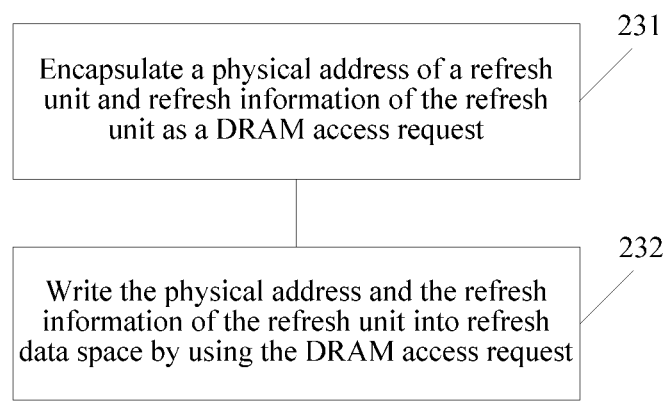
FIG. 2C is a flowchart of a first implementation manner of step 230 of Method Embodiment 1 according to the present disclosure.

Further, according to different specific implementation processes, there are two implementation manners in a process of performing step 230:

Manner 1: This manner includes implementation processes of step 231 to step 232. The acquired address of the refresh unit includes a physical address of the refresh unit. Referring to FIG. 2C, a specific process of step 230 is:

231: Encapsulate the physical address of the refresh unit and the refresh information of the refresh unit as the DRAM access request.

232: Write the physical address and the refresh information of the refresh unit into the refresh data space using the DRAM access request.

Specifically, in the foregoing implementation process, when the operating system obtains the physical address of the refresh unit and the refresh information of the refresh unit, the operating system may write the physical address of the refresh unit and the refresh information of the refresh unit into the refresh data space.

Figure 2D:
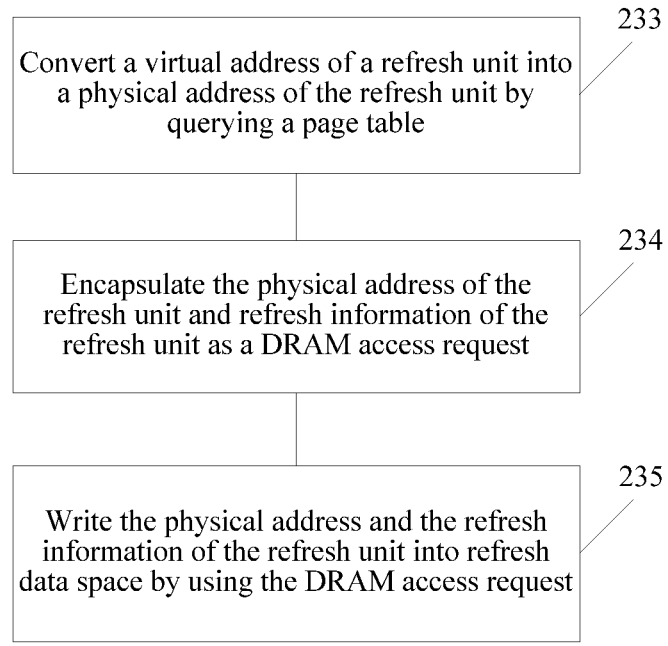
FIG. 2D is a flowchart of a second implementation manner of step 230 of Method Embodiment 1 according to the present disclosure.

Manner 2: This manner includes implementation processes of step 233 to step 235. The acquired address of the refresh unit includes a virtual address of the refresh unit. Referring to FIG. 2D, a specific process of step 230 is:

233: Convert the virtual address of the refresh unit into a physical address of the refresh unit by querying a page table.

234: Encapsulate the physical address of the refresh unit and the refresh information of the refresh unit as the DRAM access request.

235: Write the physical address and the refresh information of the refresh unit into the refresh data space using the DRAM access request.

Specifically, in the foregoing implementation process, refresh information of a refresh unit and a virtual address of the refresh unit are acquired using a user mode application. In this case, the user mode application sends the virtual address of the refresh unit and the refresh information of the refresh unit to the operating system, and the operating system obtains a physical address of the refresh unit according to the virtual address of the refresh unit and by querying a page table (Page Table), and writes the physical address and the refresh information of the refresh unit into the refresh data space.

According to the foregoing embodiment of the processing method for refreshing information of a dynamic random access memory DRAM, refresh information can be written, using an existing DRAM access request, into refresh data space allocated in advance in a DRAM, so that the method can meet a requirement of continuously expanding storage space for refresh information, where the requirement results from a continuous increase in a storage capacity of a DRAM. Moreover, storage of refresh information is implemented using the existing DRAM access request, which is a simple and practical implementation solution.

Method Embodiment 2

Figure 3A:
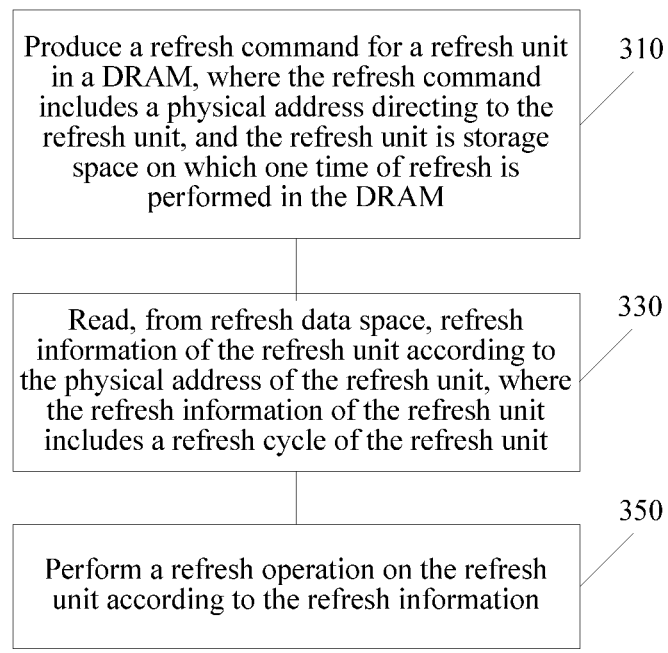
FIG. 3A is a flowchart of Method Embodiment 2 according to the present disclosure.

Referring to FIG. 3A, this embodiment provides a method for refreshing a dynamic random access memory DRAM. This method embodiment is executed by a memory controller, and a process thereof is:

310: Generate a refresh command for a refresh unit in a DRAM, where the refresh command includes a physical address directing to the refresh unit, and the refresh unit is storage space on which one time of refresh is performed in the DRAM.

Specifically, the memory controller generates a refresh command periodically, and the refresh command includes a physical address of a to-be-refreshed unit.

330: Read, from refresh data space, refresh information of the refresh unit according to the physical address of the refresh unit, where the refresh information of the refresh unit includes a refresh cycle of the refresh unit.

350: Perform a refresh operation on the refresh unit according to the refresh information.

Specifically, when the memory controller performs the refresh operation on the refresh unit according to the refresh information, with reference to Table 2, for different refresh information, the memory controller performs different refresh operations:

(1) If a data validity identifier in the refresh information read by the memory controller is 0, it indicates that data stored in a refresh unit corresponding to the refresh information is invalid data, and the memory controller discards the refresh command.

(2) If a data validity identifier in the refresh information read by the memory controller is 1 and a refresh cycle identifier is abc (where all values of a, b, and c are 1 or 0), according to content in Table 2 and Table 1, a refresh cycle of the refresh unit is determined, and the refresh unit is refreshed according to the refresh cycle.

Figure 3B:
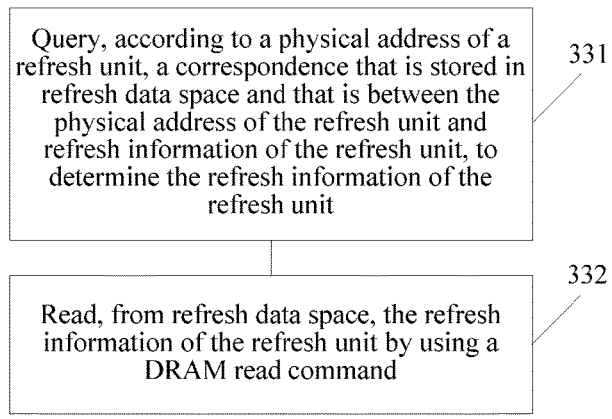
FIG. 3B is a flowchart of an implementation manner of step 330 of Method Embodiment 2 according to the present disclosure.

Further, referring to FIG. 3B, the foregoing step 330 of reading, from refresh data space according to the physical address of the refresh unit, refresh information corresponding to the refresh unit includes:

331: Query, according to the physical address of the refresh unit, a correspondence that is stored in the refresh data space and that is between the physical address of the refresh unit and the refresh information of the refresh unit, to determine the refresh information of the refresh unit.

332: Read, from the refresh data space, the refresh information of the refresh unit using the DRAM read command.

According to the physical address of the refresh unit, the memory controller reads, from the correspondence between the physical address of the refresh unit and the refresh information of the refresh unit, the refresh information of the refresh unit using the DRAM read command.

Further, the refresh data space is storage space that is preset in the DRAM and that is used for storing refresh information of multiple refresh units in the DRAM, and the method further includes:

340: Acquire, from the refresh data space, refresh information of multiple successive refresh units that are after the refresh unit.

It should be noted that, a read/write granularity of DRAM data is relatively large, which is generally 64 bytes, and according to the foregoing embodiment, storage of refresh information of one refresh unit is represented using four bits, and therefore, the DRAM reads refresh information of 128 refresh units at a time.

Figure 3C:
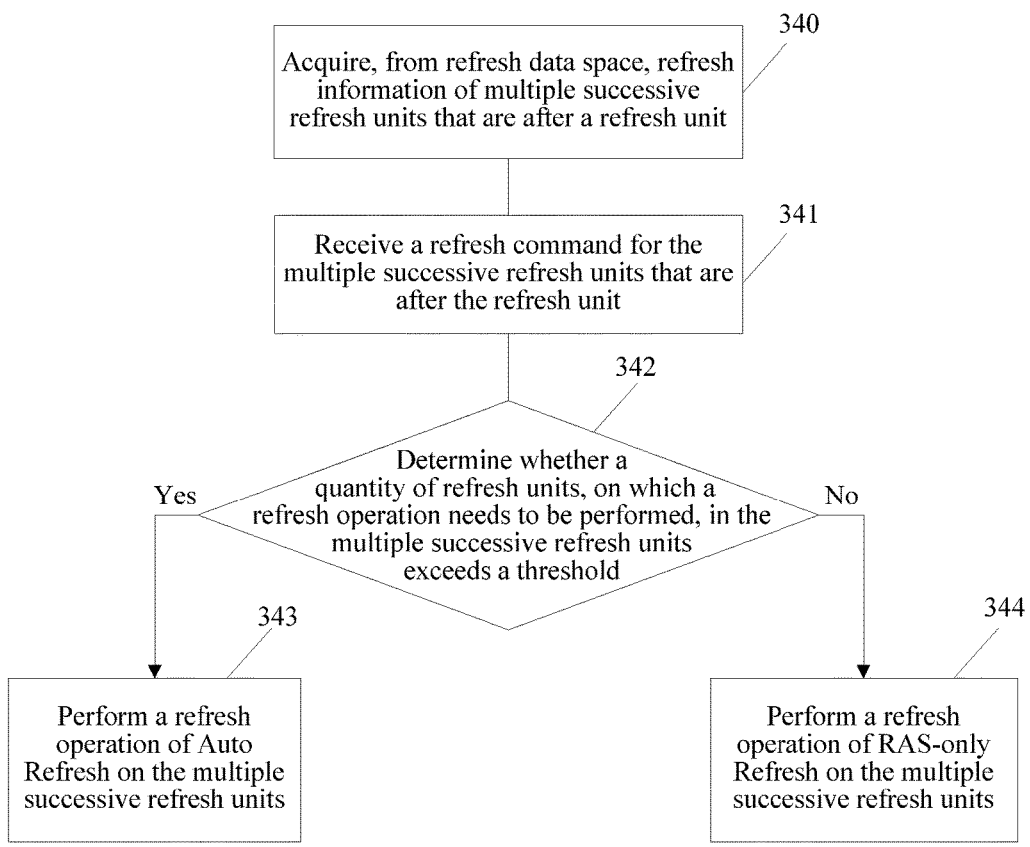
FIG. 3C is a flowchart of an implementation manner of an additional step of Method Embodiment 2 according to the present disclosure.

Further, after the reading, from the refresh data space, refresh information of multiple refresh units that are after the refresh unit, referring to FIG. 3C, the method further includes:

341: Receive a refresh command for the multiple successive refresh units that are after the refresh unit.

342: Determine whether a quantity of refresh units, on which a refresh operation needs to be performed, in the multiple successive refresh units exceeds a threshold.

343: Perform a refresh operation of Auto Refresh on the multiple successive refresh units when it is determined that the quantity of refresh units on which a refresh operation needs to be performed exceeds the threshold.

344: Perform a refresh operation of RAS-Only Refresh on the multiple successive refresh units when it is determined that the quantity of refresh units on which a refresh operation needs to be performed does not exceed the threshold.

In a specific implementation process, when a refresh operation is performed on the multiple successive refresh units using an Auto Refresh manner, the memory controller further sends a silent refresh command to the DRAM. By means of the command, in a process of refreshing the multiple successive refresh units, a refresh unit storing invalid data can be skipped, and moreover, for an address at which refresh is performed, a counter is incremented by 1, to ensure that the counter subsequently directs to a next to-be-refreshed row.

It should be noted that, using Auto Refresh and using RAS-Only Refresh are common knowledge for a person of ordinary skill in the art, and a specific execution process is not described in detail herein again.

In the foregoing embodiment, by means of accessing refresh information, which is stored in refresh data space, of a refresh unit, pertinent refresh can be performed according to the refresh information, avoiding a problem of relatively large performance overheads and energy-consumption overheads caused by refresh performed using a same cycle in the prior art. Moreover, refresh information of a refresh unit is directly read from refresh data space using an existing memory access command, so that a refreshing process is simple and practical.

Device Embodiment 1

Figure 4:
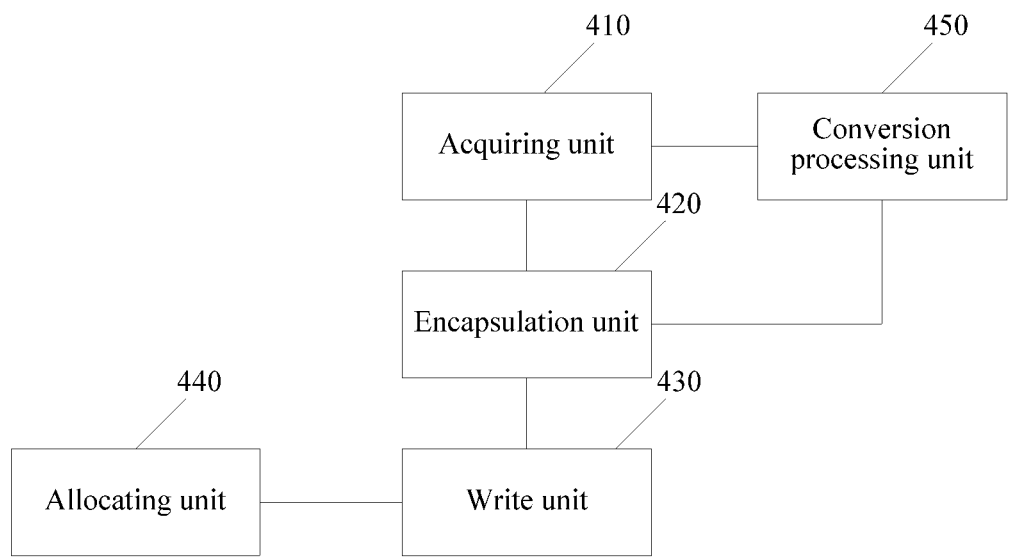
FIG. 4 is a structural diagram of Device Embodiment 1 according to the present disclosure.

Referring to FIG. 4, this embodiment provides a processing apparatus for refreshing information of a dynamic random access memory DRAM, and the apparatus 400 includes:

an acquiring unit 410, configured to acquire an address of a refresh unit in a DRAM and refresh information of the refresh unit, where the refresh unit is storage space on which one time of refresh is performed in the DRAM, and the refresh information of the refresh unit includes a refresh cycle of the refresh unit;

an encapsulation unit 420, configured to encapsulate the address of the refresh unit and the refresh information of the refresh unit as a DRAM access request; and a write unit 430, configured to write the address of the refresh unit and the refresh information of the refresh unit into refresh data space using the DRAM access request, where the refresh data space is a piece of preset storage space in the DRAM.

Further, the apparatus 400 further includes: an allocating unit 440, configured to allocate, in the DRAM, the preset storage space as the refresh data space.

Further, the address, acquired by the acquiring unit, of the refresh unit includes a physical address of the refresh unit;

the encapsulation unit 420 is further configured to encapsulate the physical address of the refresh unit and the refresh information of the refresh unit as the DRAM access request; and the write unit 430 is configured to write the physical address and the refresh information of the refresh unit into the refresh data space using the DRAM access request.

Further, the address, acquired by the acquiring unit, of the refresh unit includes a virtual address of the refresh unit; the apparatus further includes:

a conversion processing unit 450, configured to convert the virtual address of the refresh unit into a physical address of the refresh unit by querying a page table;

the encapsulation unit 420 is specifically configured to encapsulate the physical address of the refresh unit and the refresh information of the refresh unit as the DRAM access request; and the write unit 430 is specifically configured to write the physical address and the refresh information of the refresh unit into the refresh data space using the DRAM access request.

Device Embodiment 2

Figure 5:
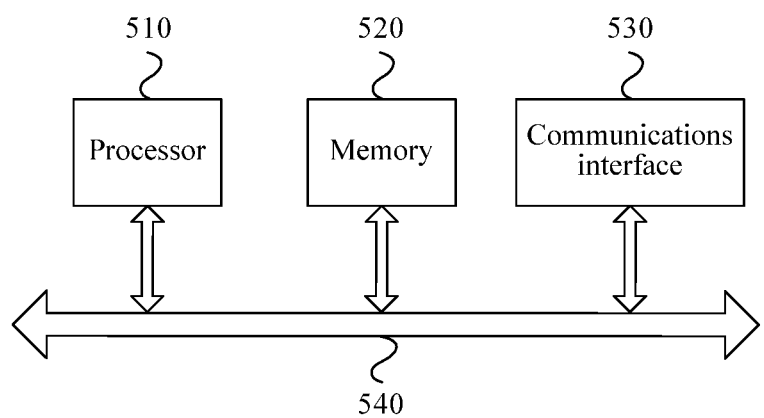
FIG. 5 is a structural diagram of Device Embodiment 2 according to the present disclosure.

Referring to FIG. 5, this embodiment further provides a processing apparatus for refreshing information of a dynamic random access memory DRAM, and the processing apparatus 500 includes:

a processor 510, a memory 520, a communications interface 530, and a bus 540, where the processor 510, the memory 520, and the communications interface 530 perform communication using the bus;

the memory 520 is configured to store a program;

the communications interface 530 is configured to communicate with a DRAM; and when the processing apparatus 500 is running, the processor 510 is configured to execute the program stored in the memory 520, so as to perform the method according to any possible implementation manner of Method Embodiment 1.

Device Embodiment 3

Figure 6A:
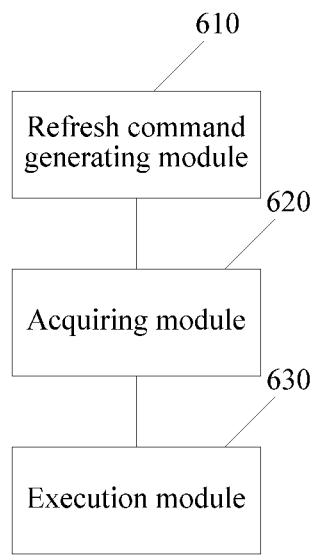
FIG. 6A is a structural diagram of Device Embodiment 2 according to the present disclosure.

Referring to FIG. 6A, this embodiment provides a DRAM controller, and the controller 600 includes:

a refresh command generating module 610, configured to generate a refresh command for a refresh unit, where the refresh command includes a physical address of the refresh unit, and the refresh unit is storage space on which one time of refresh is performed in a DRAM;

an acquiring module 620, configured to acquire, from refresh data space, refresh information of the refresh unit according to the physical address of the refresh unit and using a DRAM read command, where the refresh information of the refresh unit includes a refresh cycle of the refresh unit; and an execution module 630, configured to perform a refresh operation on the refresh unit according to the refresh information.

Figure 6B:
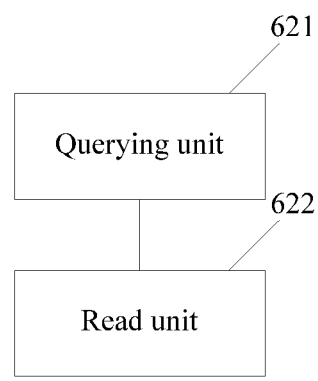
FIG. 6B is a structural diagram of an implementation manner of an acquiring module in Device Embodiment 2 according to the present disclosure.

Further, referring to FIG. 6B, the acquiring module 620 includes:

a querying unit 621, configured to determine the refresh information of the refresh unit according to the physical address of the refresh unit and a correspondence that is stored in the refresh data space and that is between the physical address of the refresh unit and the refresh information of the refresh unit; and a read unit 622, configured to read, from the refresh data space, the refresh information of the refresh unit using the DRAM read command.

Further, the acquiring module 620 is further configured to acquire, from the refresh data space, refresh information of multiple successive refresh units that are after the refresh unit.

Figure 6C:
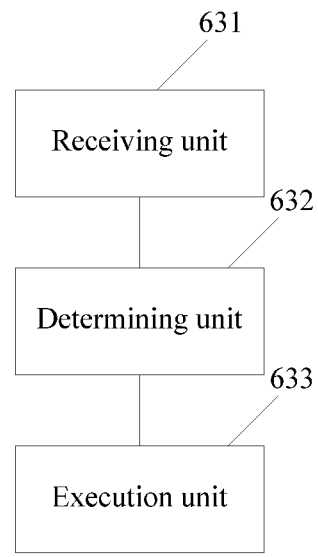
FIG. 6C is a structural diagram of an implementation manner of an execution module in Device Embodiment 2 according to the present disclosure.

Further, referring to FIG. 6C, the execution module 630 includes:

a receiving unit 631, configured to receive a refresh command for the multiple successive refresh units that are after the refresh unit;

a determining unit 632, configured to determine whether a quantity of refresh units, on which a refresh operation needs to be performed, in the multiple successive refresh units exceeds a threshold; and an execution unit 633, configured to perform a refresh operation of Auto Refresh on the multiple successive refresh units when it is determined that the quantity of refresh units on which a refresh operation needs to be performed exceeds the threshold; or perform a refresh operation of RAS-Only Refresh on the multiple successive refresh units when it is determined that the quantity of refresh units on which a refresh operation needs to be performed does not exceed the threshold.

In the foregoing implementation manner, considering a feature that the refresh manner of Auto Refresh can reduce refresh overheads and has relatively high efficiency when multiple successive refresh units all need to be refreshed, and a feature that the refresh manner of RAS-Only Refresh is applicable to refresh of one refresh unit, according to whether a quantity of refresh units on which a refresh operation actually needs to be performed exceeds a threshold for a quantity of refresh units, the Auto Refresh manner or the RAS-Only Refresh manner is selected to perform refresh, thereby improving efficiency of refresh.

Embodiment of System

Figure 7:
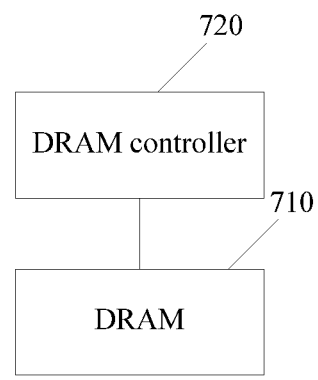
FIG. 7 is a networking connection diagram of a system embodiment of the present disclosure.

Referring to FIG. 7, this embodiment provides a system for refreshing a dynamic random access memory DRAM.

The system 700 includes a dynamic random access memory DRAM 710 including multiple refresh units, and a DRAM controller 720 as described in Device Embodiment 3.

In the several embodiments provided in the present disclosure, it should be understood that the disclosed system, apparatus, and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. A part or all of the units may be selected according to actual needs to achieve the objectives of the solutions of the embodiments of the present disclosure.

In addition, functional units in the embodiments of the present disclosure may be integrated into one processing unit, or each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions of the present disclosure essentially, or the part contributing to the prior art, or all or a part of the technical solutions may be implemented in the form of a software product. The software product is stored in a storage medium and includes several instructions for instructing a computer device (which may be a personal computer, a server, or a network device) to perform all or a part of the steps of the methods described in the embodiments of the present disclosure. The foregoing storage medium includes: any medium that can store program code, such as a USB flash drive, a removable hard disk, a read-only memory (ROM), a random access memory (RAM), a magnetic disk, or an optical disc.

The foregoing descriptions are merely specific embodiments of the present disclosure, but are not intended to limit the protection scope of the present disclosure.

What is claimed is:

1. A processing method for refreshing information of a dynamic random access memory (DRAM) in a computer system, comprising:
   acquiring, by a processor of the computer system, an address of a refresh unit in the DRAM and refresh information of the refresh unit, wherein the refresh unit is storage space on which one time of refresh is performed in the DRAM, and the refresh information of the refresh unit comprises a refresh cycle of the refresh unit;
   encapsulating, by the processor, the address of the refresh unit and the refresh information of the refresh unit as a DRAM access request; and
   writing, by the processor, the address of the refresh unit and the refresh information of the refresh unit into refresh data space using the DRAM access request, wherein the refresh data space is preset storage space in the DRAM.

2. The method according to claim 1, wherein before the writing the address of the refresh unit and the refresh information of the refresh unit into refresh data space using the DRAM access request, the method further comprises:
   allocating, by the processor, in the DRAM, the preset storage space as the refresh data space.

3. The method according to claim 1, wherein the address of the refresh unit comprises a physical address of the refresh unit.

4. The method according to claim 1, wherein the acquired address of the refresh unit comprises a virtual address of the refresh unit;
   before the encapsulating the address of the refresh unit and the refresh information of the refresh unit as a DRAM access request, the method further comprises:
   converting, by the processor, the virtual address of the refresh unit into a physical address of the refresh unit by querying a page table;
   wherein the physical address of the refresh unit and the refresh information of the refresh unit are encapsulated as the DRAM access request; and
   wherein the physical address and the refresh information of the refresh unit are written into the refresh data space using the DRAM access request.

5. The method according to claim 1, wherein the refresh cycle of the refresh unit is acquired by computing information of data holding time, information of data validity, and information of data criticality of the refresh unit.

6. A method for refreshing a dynamic random access memory DRAM in a computer system, comprising:
   generating, by a memory controller of the computer system, a refresh command for a refresh unit in the DRAM, wherein the refresh command comprises a physical address of the refresh unit, and the refresh unit is storage space on which one time of refresh is performed in the DRAM;
   reading, by the memory controller and from refresh data space, refresh information of the refresh unit according to the physical address of the refresh unit, wherein the refresh information of the refresh unit comprises a refresh cycle of the refresh unit, and wherein the refresh data space is preset storage space in the DRAM, and wherein the refresh data space is used to store the refresh information of the refresh unit; and
   performing, by the memory controller, a refresh operation on the refresh unit according to the refresh information.

7. The method according to claim 6, wherein the refresh information of the refresh unit is read from the refresh data space using the DRAM read command according to the physical address of the refresh unit and a correspondence between the physical address of the refresh unit and the refresh information of the refresh unit.

8. The method according to claim 6, wherein the refresh data space is further configured to store refresh information of multiple refresh units in the DRAM, and the method further comprises:
   acquiring, by the processor and from the refresh data space, refresh information of multiple successive refresh units that are after the refresh unit.

9. The method according to claim 8, wherein after the acquiring step, the method further comprises:
   receiving, by the memory controller, a refresh command for the multiple successive refresh units that are after the refresh unit; and performing, by the memory controller, a refresh operation of Auto Refresh on the multiple successive refresh units when the quantity of refresh units on which a refresh operation needs to be performed exceeds a threshold.

10. The method according to claim 8, wherein after the acquiring step, the method further comprises:
receiving, by the memory controller, a refresh command for the multiple successive refresh units that are after the refresh unit; and
performing, by the memory controller, a refresh operation of RAS-Only Refresh on the multiple successive refresh units when the quantity of refresh units on which a refresh operation needs to be performed does not exceed a threshold.

11. A computer system, comprising a dynamic random access memory (DRAM) and a processor coupled to the DRAM, wherein the processor is configured to:
acquire an address of a refresh unit in the DRAM and refresh information of the refresh unit, wherein the refresh unit is storage space on which one time of refresh is performed in the DRAM, and the refresh information of the refresh unit comprises a refresh cycle of the refresh unit;
encapsulate the address of the refresh unit and the refresh information of the refresh unit as a DRAM access request; and
write the address of the refresh unit and the refresh information of the refresh unit into refresh data space using the DRAM access request, wherein the refresh data space is preset storage space in the DRAM.

12. The computer system according to the claim 11, wherein the address of the refresh unit comprises a physical address of the refresh unit.

13. The computer system according to the claim 11, wherein the acquired address of the refresh unit comprises a virtual address of the refresh unit, and wherein the processor is further configured to:
convert the virtual address of the refresh unit into a physical address of the refresh unit by querying a page table;
wherein in the step of the encapsulating, the processor is configured to:
encapsulate the physical address of the refresh unit and the refresh information of the refresh unit as the DRAM access request; and
wherein in the step of the writing, the processor is configured to:
write the physical address and the refresh information of the refresh unit into the refresh data space using the DRAM access request.

14. The computer system according to the claim 11, wherein the refresh cycle of the refresh unit is acquired by computing information of data holding time, information of data validity, and information of data criticality of the refresh unit.

15. A computer system, comprising a dynamic random access memory (DRAM) and a memory controller coupled to the DRAM, wherein the memory controller is configured to:
generate a refresh command for a refresh unit in the DRAM, wherein the refresh command comprises a physical address of the refresh unit, and the refresh unit is storage space on which one time of refresh is performed in the DRAM;
read, from refresh data space, refresh information of the refresh unit according to the physical address of the refresh unit, wherein the refresh information of the refresh unit comprises a refresh cycle of the refresh unit, and wherein the refresh data space is preset storage space in the DRAM, and wherein the refresh data space is used to store the refresh information of the refresh unit; and
perform a refresh operation on the refresh unit according to the refresh information.

16. The computer system according to the claim 15, wherein the refresh information of the refresh unit is read from the refresh data space using the DRAM read command according to the physical address of the refresh unit and a correspondence between the physical address of the refresh unit and the refresh information of the refresh unit.

17. The computer system according to the claim 15, wherein the refresh data space is further configured to store refresh information of multiple refresh units in the DRAM, and wherein the memory controller is further configured to:
acquire, from the refresh data space, refresh information of multiple successive refresh units that are after the refresh unit.

18. The computer system according to the claim 17, wherein the memory controller is further configured to:
receive a refresh command for the multiple successive refresh units that are after the refresh unit; and
perform a refresh operation of Auto Refresh on the multiple successive refresh units when the quantity of refresh units on which a refresh operation needs to be performed exceeds a threshold.

19. The computer system according to the claim 17, wherein the memory controller is further configured to:
receive a refresh command for the multiple successive refresh units that are after the refresh unit; and
perform a refresh operation of RAS-Only Refresh on the multiple successive refresh units when the quantity of refresh units on which a refresh operation needs to be performed does not exceed a threshold.

* * * * *